United States Patent

Wu

(10) Patent No.: US 8,274,219 B2
(45) Date of Patent: Sep. 25, 2012

(54) ELECTRO-LUMINESCENT DISPLAY PANEL INCLUDING A PLURALITY OF ISLAND PATTERNS SERVING AS AN ENCAPSULATION FILM

(75) Inventor: Wen-Hao Wu, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/871,926

(22) Filed: Aug. 31, 2010

(65) Prior Publication Data

US 2011/0248288 A1    Oct. 13, 2011

(30) Foreign Application Priority Data

Apr. 13, 2010    (TW) ................. 99111436 A

(51) Int. Cl.
*H01L 33/08* (2010.01)
(52) U.S. Cl. .......... 313/512; 313/509; 313/511; 445/24; 445/25
(58) Field of Classification Search .......... 313/498–512; 315/169.1, 169.3; 257/40, 72, 98–100, 642–643, 257/759
See application file for complete search history.

(56) References Cited

U.S. PATENT DOCUMENTS

| 6,822,256 | B2 | 11/2004 | Kwasnick et al. | |
|---|---|---|---|---|
| 6,949,389 | B2 | 9/2005 | Pichler et al. | |
| 7,187,006 | B2* | 3/2007 | Hayashi | 257/72 |
| 2005/0046339 | A1* | 3/2005 | Ju et al. | 313/504 |
| 2007/0152212 | A1* | 7/2007 | Cho et al. | 257/40 |
| 2007/0259588 | A1 | 11/2007 | Masumo | |
| 2008/0284331 | A1* | 11/2008 | Hayashi | 313/512 |
| 2010/0132762 | A1* | 6/2010 | Graham et al. | 136/244 |

* cited by examiner

*Primary Examiner* — Tracie Y Green
(74) *Attorney, Agent, or Firm* — Jianq Chyun IP Office

(57) ABSTRACT

An electro-luminescent display panel including an active device array substrate, a pixel definition layer, electro-luminescent devices, an electrode layer and a protective layer is provided. The substrate includes pixel electrodes. The pixel definition layer on the substrate includes openings, each exposing the corresponding one of the pixel electrodes. The electro-luminescent devices are in the openings. Each electro-luminescent device layer is on the corresponding one of the pixel electrode. The electrode layer is on the pixel definition layer and the electro-luminescent devices. The protective layer including a buffer layer, a first and a second encapsulation films is on the electrode layer. The buffer layer covers the pixel definition layer and the electro-luminescent devices. The first encapsulation film partially covers the buffer layer. The first encapsulation film includes island patterns on the pixel electrodes. The second encapsulation film covers the buffer layer and the first encapsulation film.

27 Claims, 3 Drawing Sheets

ELECTRO-LUMINESCENT DISPLAY PANEL INCLUDING A PLURALITY OF ISLAND PATTERNS SERVING AS AN ENCAPSULATION FILM

CROSS-REFERENCE TO RELATED APPLICATION

This application claims the priority benefit of Taiwan application serial no. 99111436, filed on Apr. 13, 2010. The entirety of the above-mentioned patent application is hereby incorporated by reference herein and made a part of this specification.

BACKGROUND OF THE INVENTION

1. Field of the Invention

The invention relates generally to a display panel, and more particularly, to a electro-luminescent display panel.

2. Description of Related Art

With the recent progress in display technologies, the use of displays is making people's lives ever more convenient. Due to demands on light and thin displays, flat panel displays have now become mainstream display products.

Among the different types of flat panel displays, since an active matrix electro-luminescent display (AMLED) is characterized by wide view angle, high color contrast, thinness and light weight, fast response speed, low cost, and so on, the AMLED is quite suitable for use in portable imaging products (e.g., notebook computer, PDA, mobile phone), and especially in large display devices such as a television.

In a conventional AMLED, a buffer layer usually covers an electro-luminescent device. Moreover, an organic layer and an inorganic layer covers the buffer layer in sequence, so as to prevent water vapor or oxygen from contacting the electro-luminescent device and causing device damage, and to smoothen the device surface. However, while forming the buffer layer, the organic layer, and the inorganic layer, pin holes are unavoidably produced in each film layer. Through these pin holes, water vapor and oxygen may come in contact with the electro-luminescent device. Furthermore, water vapor and oxygen in the organic layer may very easily spread outside of the pin hole regions and likely cause a large area of device damage.

SUMMARY OF THE INVENTION

An aspect of the invention provides an electro-luminescent display panel capable of effectively preventing water vapor and oxygen from spreading in the organic layers.

Another aspect of the invention provides an electro-luminescent display panel capable of effectively preventing a large area of device damage.

An aspect of the invention provides an electro-luminescent display panel, including an active device array substrate, a pixel definition layer, a plurality of electro-luminescent devices, an electrode layer, and a protective layer. The active device array substrate includes a plurality of pixel electrodes arranged in array. The pixel definition layer is disposed on the active device array substrate, in which the pixel definition layer includes a plurality of openings arranged in array, and the openings expose the pixel electrodes, respectively. The electro-luminescent devices are disposed in the openings, in which the electro-luminescent devices are disposed on the pixel electrodes, respectively. The electrode layer covers the pixel definition layer and the electro-luminescent devices. The protective layer covers the electrode layer. Moreover, the protective layer includes a buffer layer, a first encapsulation film, and a second encapsulation film. The buffer layer covers the pixel definition layer and the electro-luminescent devices. The first encapsulation layer partially covers the buffer layer. The first encapsulation film includes a plurality of island patterns separated from each other, and the island patterns are disposed above the pixel electrodes. The second encapsulation film covers the buffer layer and the first encapsulation film.

According to the electro-luminescent display panel in an embodiment of the invention, the active device array substrate includes a plurality of scan lines, a plurality of data lines, and a plurality of active devices. The active devices are electrically connected correspondingly to the scan lines, the data lines, and the pixel electrodes. Moreover, the scan lines, the data lines, and the active devices are covered by the pixel definition layer.

According to the electro-luminescent display panel in an embodiment of the invention, a water vapor transmission rate (WVTR) of the first encapsulation film is, for example, greater than that of the second encapsulation film.

According to the electro-luminescent display panel in an embodiment of the invention, an oxygen transmission rate (OTR) of the first encapsulation film is, for example, greater than that of the second encapsulation film.

According to the electro-luminescent display panel in an embodiment of the invention, the WVTR of the first encapsulation film is, for example, between 0.1 $g/m^2/day$ to 100 $g/m^2/day$, and the WVTR of the second encapsulation film is between 1 $g/m^2/day$ to 50 $g/m^2/day$.

According to the electro-luminescent display panel in an embodiment of the invention, the OTR of the first encapsulation film is, for example, between 0.1 $c.c./m^2/day$ to 100 $c.c./m^2/day$, and the OTR of the second encapsulation film is between 1 $c.c./m^2/day$ to 50 $c.c./m^2/day$.

According to the electro-luminescent display panel in an embodiment of the invention, a material of the buffer layer and the second encapsulation film comprises an inorganic material, for example, and a material of the first encapsulation film comprises an organic material.

According to the electro-luminescent display panel in an embodiment of the invention, the island patterns are disposed in the openings, respectively, for example.

According to the electro-luminescent display panel in an embodiment of the invention, each of the electro-luminescent devices includes a light emitting layer, a hole injection layer, a hole transport layer, and an electron injection layer. The light emitting layer is disposed between one of the pixel electrodes and the electrode layer. The hole injection layer is disposed between one of the pixel electrodes and the light emitting layer. The hole transport layer is disposed between the hole injection layer and the light emitting layer. The electron injection layer is disposed between the light emitting layer and the electrode layer.

Another aspect of the invention provides an electro-luminescent display panel, including an active device array substrate, a pixel definition layer, a plurality of electro-luminescent devices, an electrode layer, and a protective layer. The active device array substrate includes a plurality of pixel electrodes arranged in array. The pixel definition layer is disposed on the active device array substrate, in which the pixel definition layer includes a plurality of openings arranged in array, and the openings expose the pixel electrodes respectively. The electro-luminescent devices are disposed in the openings, in which the electro-luminescent devices are disposed on the pixel electrodes, respectively. The electrode layer covers the pixel definition layer and the electro-luminescent devices. The protective layer covers the electrode layer. The protective layer includes a first encapsulation film. The first encapsulation film includes a plurality of island patterns separated from each other, and the island patterns are substantially disposed above the pixel electrodes.

According to the electro-luminescent display panel in an embodiment of the invention, the WVTR of the first encapsulation film is, for example, between 0.1 g/m$^2$/day to 100 g/m$^2$/day.

According to the electro-luminescent display panel in an embodiment of the invention, the OTR of the first encapsulation film is, for example, between 0.1 c.c./m$^2$/day to 100 c.c./m$^2$/day.

According to the electro-luminescent display panel in an embodiment of the invention, a material of the first encapsulation film comprises an organic material.

In summary, according to embodiments of the invention, each of the encapsulation films formed by organic materials is disposed in each of the openings of the pixel definition layer, such that these encapsulation films formed by organic materials are disconnected from each other. Therefore, when water vapor and oxygen enter through the pin holes in the film layers, water vapor and oxygen may be prevented from spreading in the encapsulation films formed by organic materials. Thereby, damage done to the electro-luminescent device may be reduced.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
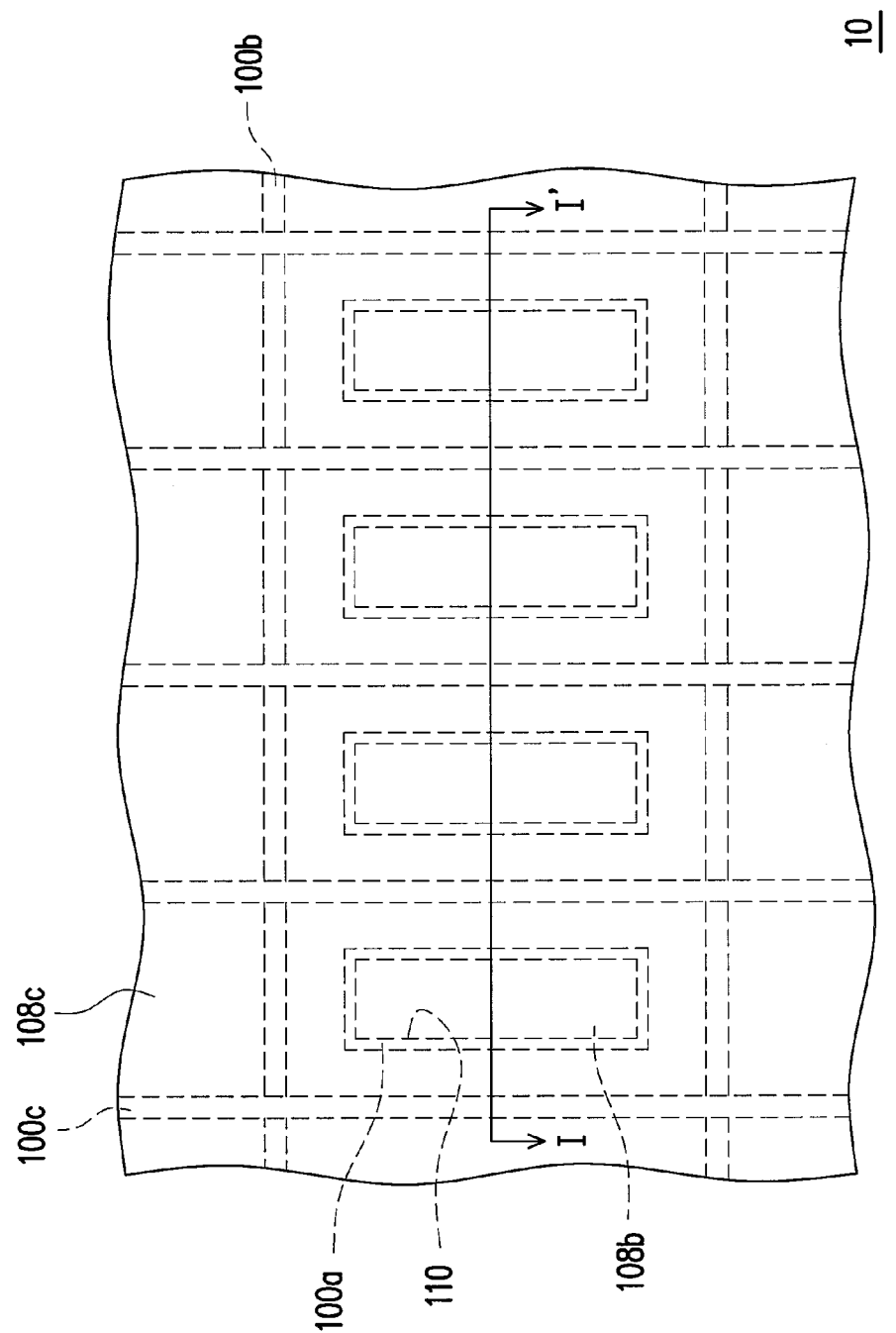
FIG. 1A is a schematic top view of an electro-luminescent display panel in accordance with an embodiment of the invention.
Figure 1B:
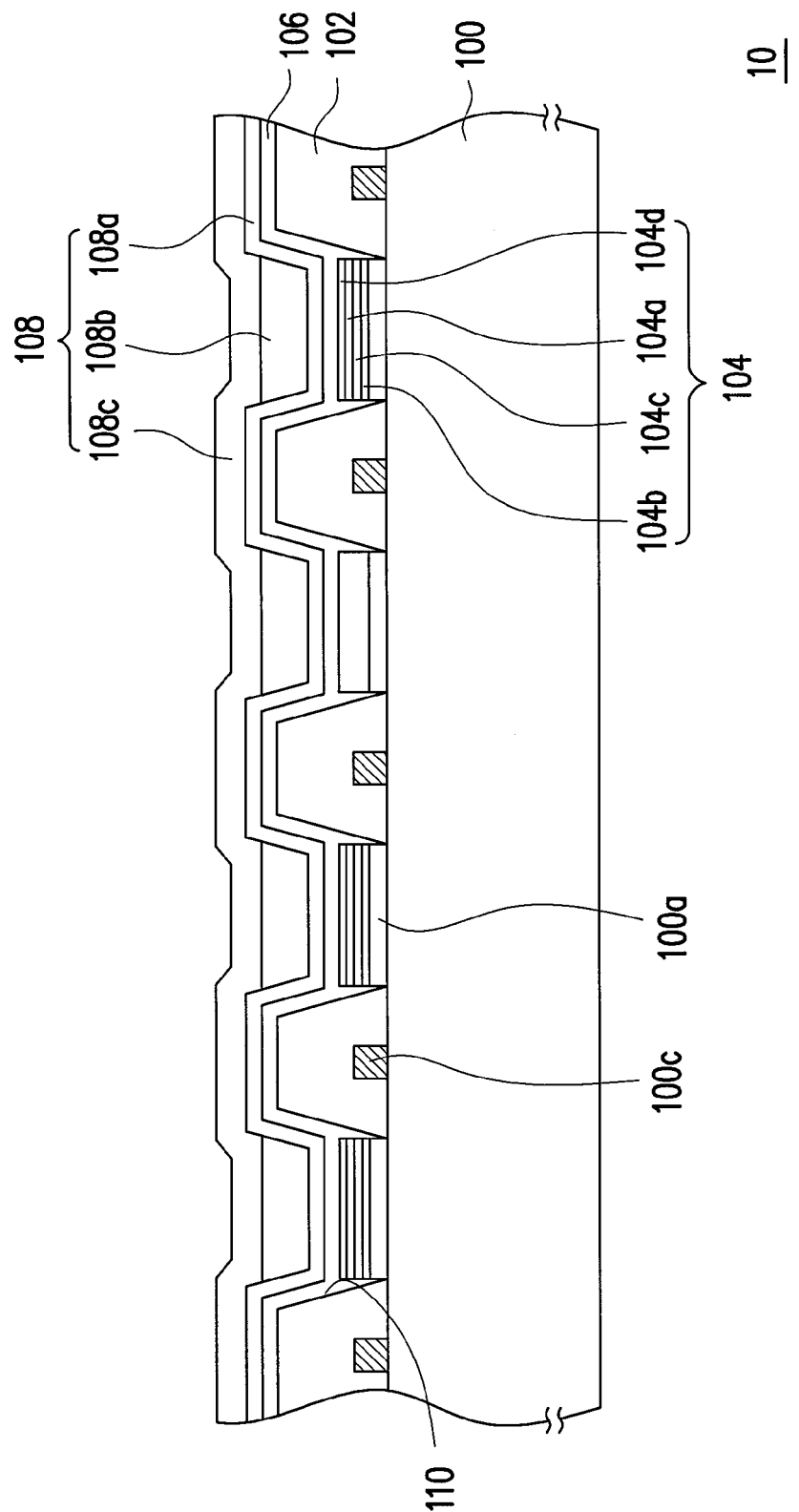
FIG. 1B is a schematic cross-sectional view of the electro-luminescent display panel taken along a section line I-I' depicted in FIG. 1A.

FIG. 1A is a schematic top view of an electro-luminescent display panel in accordance with an embodiment of the invention. FIG. 1B is a schematic cross-sectional view of the electro-luminescent display panel taken along a section line I-I' depicted in FIG. 1A. Referring to FIGS. 1A and 1B, an electro-luminescent display panel 10 includes an active device array substrate 100, a pixel definition layer 102, a plurality of electro-luminescent devices 104, an electrode layer 106, and a protective layer 108. A material of the active device array substrate 100 comprises glass, plastic, or other suitable materials, for example. The active device array substrate 100 includes a plurality of pixel electrodes arranged in array, for example. A material of the pixel electrodes 100a comprises indium tin oxide (ITO) or indium zinc oxide (IZO), for example. Moreover, the active device array substrate 100 further includes a plurality of scan lines 100b, a plurality of data lines 100c, and a plurality of active devices (not drawn for clarity of illustration). The scan lines 100b and the data lines 100c are perpendicular to each other. Each of the active devices is electrically connected to the corresponding one of the scan lines 100b, one of the data lines 100c, and one of the pixel electrodes 100a. A material of the scan lines 100b and the data lines 100c comprises metal, for instance. Each of the active devices includes a gate, a gate insulating layer, a channel layer, a source, and a drain. Detailed arrangements of the active devices are well known to persons having ordinary knowledge in the art, therefore no further description is given herein.

The pixel definition layer 102 is disposed on the active device array substrate 100. The pixel definition layer 102 disposed on the scan lines 100b, the data lines 100c, and the active device, so as to define a pixel region. A material of the pixel definition layer 102 comprises acrylic, for example. The pixel definition layer 102 includes a plurality of openings 110. The openings 110 are arranged in array, and the openings 110 expose the pixel electrodes 100a, respectively.

The electro-luminescent devices 104 are disposed in the openings 110, and the electro-luminescent devices 104 are disposed on the pixel electrodes 100a respectively. Each of the electro-luminescent devices 104 includes a light emitting layer 104a, a hole injection layer 104b, a hole transport layer 104c, and an electron injection layer 104d. The hole injection layer 104b, the hole transport layer 104c, the light emitting layer 104a, and the electron injection layer 104d are stacked in sequence on one of the pixel electrodes 100a. A material of each of the film layers in the electro-luminescent devices 104 may comprise a material adopted in a conventional electro-luminescent device layer. The light emitting layer 104a is an organic emitting layer or an inorganic emitting layer, for example. A material of the organic emitting layer comprises Alq, for instance. A material of the hole injection layer 104b comprises CuPc, a material of the hole transport layer 104c comprises NPB, and a material of the electron injection layer 104d comprises LiF, for example. The light emitting layer 104a, the hole injection layer 104b, the hole transport layer 104c, and the electron injection layer 104d are formed by an ink jet printing process, for instance. Moreover, in other embodiments of the invention, an electron transport layer may be disposed between the electron injection layer 104d and the light emitting layer 104a in accordance to an actual need. Additionally, a hole barrier layer may be disposed between the light emitting layer 104a and the electron injection layer 104d or the electron transport layer.

For example, the electrode layer 106 conformally covers the pixel definition layer 102 and the electro-luminescent devices 104, so as to serve as a common electrode. A material of the electrode layer 106 comprises aluminum, for example.

The protective layer 108 covers the electrode layer 106. More specifically, the protective layer 108 includes a buffer layer 108a, an encapsulation film 108b, and an encapsulation film 108c. For example, the electrode layer 106 conformally covers the pixel definition layer 102 and the electro-luminescent devices 104 so as to serve as a common electrode. A material of the buffer layer 108a comprises an inorganic material, for example. The encapsulation film 108b may partially cover the buffer layer 108a. In the present embodiment, the encapsulation film 108b includes, for example, a plurality of island patterns separated from each other, and the island patterns are disposed in the openings 110 and only located above and overlapped with the pixel electrodes 100a, i.e. the island patterns are substantially not above the area where the pixel electrodes 100a do not locate on. In another embodiment of the invention, besides being disposed in the openings 110, the encapsulation film 108b may be disposed on the buffer layer 108a surrounding the openings 110. A material of the encapsulation film 108b comprises an organic material, for example. Moreover, a water vapor transmission rate (WVTR) of the encapsulation film 108b is, for instance, about 0.1 g/m²/day to about 100 g/m²/day, and an oxygen transmission rate (OTR) of the encapsulation film 108b is, for example, about 0.1 c.c./m²/day to about 100 c.c./m²/day. Furthermore, the encapsulation film 108c covers the buffer layer 108a and the encapsulation film 108b. A material of the encapsulation film 108c comprises an inorganic material, for example. Moreover, an WVTR of the encapsulation film 108c is, for instance, about 1 g/m²/day to about 50 g/m²/day, and an OTR of the encapsulation film 108c is, for example, about 1 c.c./m²/day to about 50 c.c./m²/day. In an embodiment of invention, the WVTR of the encapsulation film 108b is, for example, greater than that of the encapsulation film 108c. In an embodiment of invention, the OTR of the encapsulation film 108b is, for example, greater than that of the encapsulation film 108c.

As shown in FIG. 1B, each of the encapsulation films 108b formed by organic materials is disposed in each of the openings 110 and disconnected from each other. Therefore, when water vapor and oxygen enter through the pin holes in each of the film layers, water vapor and oxygen cannot spread into other regions through the encapsulation film 108b. Hence, damage cannot be done to a large area of the device.

It is particularly worth noting that, in the present embodiment, the protective layer 108 is constituted by a buffer layer 108a formed by inorganic materials, an encapsulation film 108b formed by organic materials, and an encapsulation film 108c formed by inorganic materials. However, in other embodiments of the invention, the protective layer may be constituted by a buffer layer 108a and a composite layer formed by a plurality of organic material layers and a plurality of inorganic material layers alternately stacked in sequence.

Figure 2:
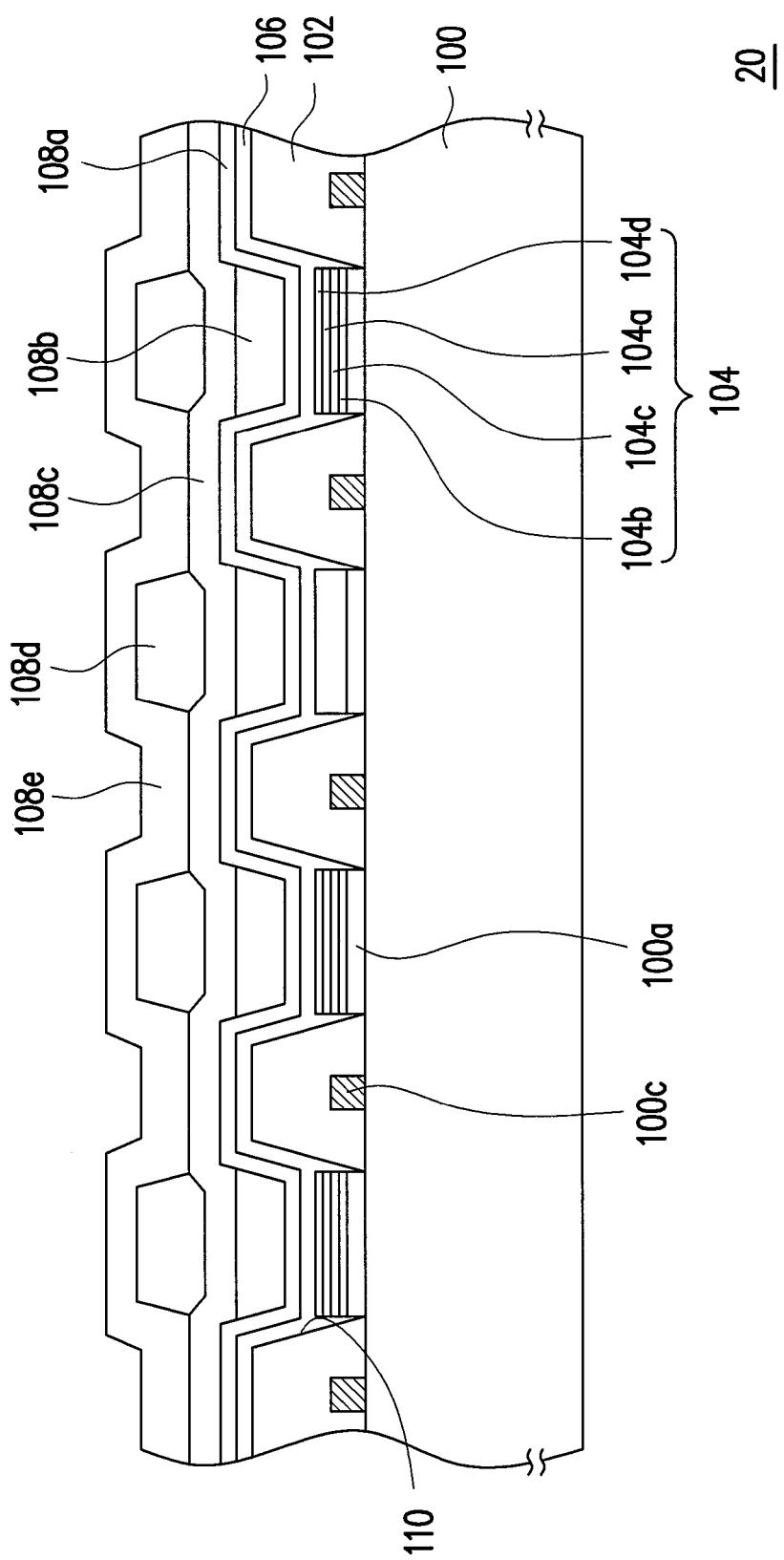
FIG. 2 is a schematic cross-sectional view of an electro-luminescent display panel in accordance with another embodiment of the invention.

FIG. 2 is a schematic cross-sectional view of an electro-luminescent display panel in accordance with another embodiment of the invention. Referring to FIG. 2, in the present embodiment, a difference between an electro-luminescent display panel 20 and the electro-luminescent display panel 10 is that, in the electro-luminescent display panel 20, the protective layer is constituted by a buffer layer 108a, an encapsulation film 108b (e.g., formed by organic materials), an encapsulation film 108c (e.g., formed by inorganic materials), an encapsulation film 108d (e.g., formed by organic materials), and an encapsulation film 108e (e.g., formed by inorganic materials). However, in other embodiments of the invention, even more organic material layers and inorganic material layers may be continually stacked in accordance to an actual need.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electro-luminescent display panel, comprising:
   an active device array substrate comprising a plurality of pixel electrodes, a plurality of scan lines, a plurality of data lines, and a plurality of active devices;
   a pixel definition layer disposed on the active device array substrate, wherein the pixel definition layer comprises a plurality of openings exposing the pixel electrodes, respectively;
   a plurality of electro-luminescent devices disposed in the openings and on the pixel electrodes, respectively;
   an electrode layer disposed on the pixel definition layer and the electro-luminescent devices; and
   a protective layer disposed on the electrode layer, comprising:
      a buffer layer disposed on the electrode layer;
      a first encapsulation film disposed on the buffer layer, the first encapsulation film comprising a plurality of island patterns located above the pixel electrodes, respectively, wherein the plurality of island patterns are not overlapped with the plurality of data lines; and
      a second encapsulation film disposed on the buffer layer and the first encapsulation film, wherein a WVTR of the first encapsulation film is about 0.1 g/m²/day to about 100 g/m²/day, and a WVTR of the second encapsulation film is about 1 g/m²/day to about 50 g/m²/day.

2. The electro-luminescent display panel as claimed in claim 1, wherein the active device array substrate comprises a plurality of scan lines, a plurality of data lines, and a plurality of active devices, the active devices electrically connected with the scan lines, the data lines, and the pixel electrodes, and the scan lines, the data lines, and the active devices are covered by the pixel definition layer, and wherein the electro-luminescent display panel further comprises:
   a third encapsulation film formed by organic material, disposed over the second encapsulation film; and
   a fourth encapsulation film formed by inorganic material disposed over the third encapsulation film.

3. The electro-luminescent display panel as claimed in claim 1, wherein an oxygen transmission rate (OTR) of the first encapsulation film is greater than that of the second encapsulation film.

4. The electro-luminescent display panel as claimed in claim 1, wherein an OTR of the first encapsulation film is about 0.1 c.c./m²/day to about 100 c.c./m²/day, and an OTR of the second encapsulation film is about 1 c.c./m²/day to about 50 c.c./m²/day.

5. The electro-luminescent display panel as claimed in claim 1, wherein a material of the buffer layer and the second encapsulation film comprises an inorganic material, and a material of the first encapsulation film comprises an organic material.

6. The electro-luminescent display panel as claimed in claim 1, wherein the island patterns are disposed in the openings respectively.

7. The electro-luminescent display panel as claimed in claim 1, wherein each of the electro-luminescent devices comprises:
   a light emitting layer disposed between one of the pixel electrodes and the electrode layer;
   a hole injection layer disposed between one of the pixel electrodes and the light emitting layer;
   a hole transport layer disposed between the hole injection layer and the light emitting layer; and
   an electron injection layer disposed between the light emitting layer and the electrode layer.

8. The electro-luminescent display panel as claimed in claim 7, wherein the light emitting layer comprises an organic emitting layer or an inorganic emitting layer.

9. The electro-luminescent display panel as claimed in claim 1, wherein the plurality of island patterns are separated from each other, and wherein the plurality of island patterns are overlapped with the pixel electrodes, respectively.

10. An electro-luminescent display panel, comprising:
    an active device array substrate comprising a plurality of pixel electrodes, a plurality of scan lines, a plurality of data lines, and a plurality of active devices;

a pixel definition layer disposed on the active device array substrate, wherein the pixel definition layer comprises a plurality of openings exposing the pixel electrodes, respectively;

a plurality of electro-luminescent devices disposed in the openings and on the pixel electrodes, respectively;

an electrode layer disposed on the pixel definition layer and the electro-luminescent devices; and a protective layer disposed on the electrode layer, comprising:

a first encapsulation film comprising a plurality of island patterns, wherein the island patterns are substantially disposed above the pixel electrodes, respectively, the plurality of island patterns are not overlapped with the plurality of data lines, the island patterns are not above an area where the pixel electrodes do not locate on, and a WVTR of the first encapsulation film is about 0.1 g/m$^2$/day to about 100 g/m$^2$/day.

11. The electro-luminescent display panel as claimed in claim 10, wherein the active device array substrate comprises:
a plurality of scan lines;
a plurality of data lines; and
a plurality of active devices electrically connected correspondingly with the scan lines, the data lines, and the pixel electrodes, wherein the scan lines, the data lines, and the active devices are covered by the pixel definition layer.

12. The electro-luminescent display panel as claimed in claim 10, wherein an OTR of the first encapsulation film is about 0.1 c.c./m$^2$/day to about 100 c.c./m$^2$/day.

13. The electro-luminescent display panel as claimed in claim 10, wherein a material of the first encapsulation film comprises an organic material.

14. The electro-luminescent display panel as claimed in claim 10, wherein the island patterns are disposed in the openings, respectively.

15. The electro-luminescent display panel as claimed in claim 10, wherein each of the electro-luminescent devices comprises:
a light emitting layer disposed between one of the pixel electrodes and the electrode layer;
a hole injection layer disposed between one of the pixel electrodes and the light emitting layer;
a hole transport layer disposed between the hole injection layer and the light emitting layer; and
an electron injection layer disposed between the light emitting layer and the electrode layer.

16. The electro-luminescent display panel as claimed in claim 15, wherein the light emitting layer comprises an organic emitting layer or an inorganic emitting layer.

17. An electro-luminescent display panel, comprising:
an active device array substrate comprising a plurality of pixel electrodes, a plurality of scan lines, a plurality of data lines, and a plurality of active devices;
a pixel definition layer disposed on the active device array substrate, wherein the pixel definition layer comprises a plurality of openings exposing the pixel electrodes, respectively;
a plurality of electro-luminescent devices disposed in the openings and on the pixel electrodes, respectively;
an electrode layer disposed on the pixel definition layer and the electro-luminescent devices; and
a protective layer disposed on the electrode layer, comprising:
a first encapsulation film comprising a plurality of island patterns, wherein the island patterns are substantially disposed above the pixel electrodes exposed from the openings of the definition layer, respectively, the plurality of island patterns are not overlapped with the plurality of data lines, and a WVTR of the first encapsulation film is about 0.1 g/m$^2$/day to about 100 g/m$^2$/day.

18. An electro-luminescent display panel, comprising:
an active device array substrate comprising a plurality of pixel electrodes, a plurality of scan lines, a plurality of data lines, and a plurality of active devices;
a pixel definition layer disposed on the active device array substrate, wherein the pixel definition layer comprises a plurality of openings exposing the pixel electrodes, respectively;
a plurality of electro-luminescent devices disposed in the openings and on the pixel electrodes, respectively;
an electrode layer disposed on the pixel definition layer and the electro-luminescent devices; and
a protective layer disposed on the electrode layer, comprising:
a first encapsulation film comprising a plurality of island patterns, wherein the island patterns are substantially disposed above the electro-luminescent devices in the openings, respectively, the plurality of island patterns are not overlapped with the plurality of data lines, and a WVTR of the first encapsulation film is about 0.1 g/m$^2$/day to about 100 g/m$^2$/day.

19. An electro-luminescent display panel, comprising:
an active device array substrate comprising a plurality of pixel electrodes, a plurality of scan lines, a plurality of data lines, and a plurality of active devices;
a pixel definition layer disposed on the active device array substrate, wherein the pixel definition layer comprises a plurality of openings exposing the pixel electrodes, respectively;
a plurality of electro-luminescent devices disposed in the openings and on the pixel electrodes, respectively;
an electrode layer disposed on the pixel definition layer and the electro-luminescent devices; and
a protective layer disposed on the electrode layer, comprising:
a buffer layer disposed on the electrode layer;
a first encapsulation film disposed on the buffer layer, the first encapsulation film comprising a plurality of island patterns located above the pixel electrodes, respectively, wherein the plurality of island patterns are not overlapped with the plurality of data lines; and
a second encapsulation film disposed on the buffer layer and the first encapsulation film, wherein an OTR of the first encapsulation film is about 0.1 c.c./m$^2$/day to about 100 c.c./m$^2$/day, and an OTR of the second encapsulation film is about 1 c.c./m$^2$/day to about 50 c.c./m$^2$/day.

20. An electro-luminescent display panel, comprising:
an active device array substrate comprising a plurality of pixel electrodes, a plurality of scan lines, a plurality of data lines, and a plurality of active devices;
a pixel definition layer disposed on the active device array substrate, wherein the pixel definition layer comprises a plurality of openings exposing the pixel electrodes, respectively;
a plurality of electro-luminescent devices disposed in the openings and on the pixel electrodes, respectively;
an electrode layer disposed on the pixel definition layer and the electro-luminescent devices; and
a protective layer disposed on the electrode layer, comprising:
a first encapsulation film comprising a plurality of island patterns, wherein the island patterns are substantially disposed above the pixel electrodes, respectively, the island patterns are not above an area where the pixel electrodes do not locate on, the plurality of island patterns are not overlapped with the plurality of data lines, and an OTR of the first encapsulation film is about 0.1 c.c./m$^2$/day to about 100 c.c./m$^2$/day.

21. The electro-luminescent display panel as claimed in claim 20, wherein the plurality of island patterns are substantially located in the plurality of openings, respectively.

22. The electro-luminescent display panel as claimed in claim 1, wherein the plurality of island patterns are substantially located in the plurality of openings, respectively.

23. The electro-luminescent display panel as claimed in claim 10, wherein the plurality of island patterns are substantially located in the plurality of openings, respectively.

24. The electro-luminescent display panel as claimed in claim 17, wherein the plurality of island patterns are substantially located in the plurality of openings, respectively.

25. The electro-luminescent display panel as claimed in claim 18, wherein the plurality of island patterns are substantially located in the plurality of openings, respectively.

26. The electro-luminescent display panel as claimed in claim 19, wherein the plurality of island patterns are substantially located in the plurality of openings, respectively.

27. An electro-luminescent display panel, comprising:
an active device array substrate comprising a plurality of pixel electrodes;
a pixel definition layer disposed on the active device array substrate, wherein the pixel definition layer comprises a plurality of openings exposing the pixel electrodes, respectively;
a plurality of electro-luminescent devices disposed in the openings and on the pixel electrodes, respectively;
an electrode layer disposed on the pixel definition layer and the electro-luminescent devices; and
a protective layer disposed on the electrode layer, comprising:
 a buffer layer disposed on the electrode layer;
 a first encapsulation film disposed on the buffer layer, the first encapsulation film comprising a plurality of island patterns located above the pixel electrodes, respectively, wherein the plurality of island patterns are substantially located in the plurality of openings, respectively; and
 a second encapsulation film disposed on the buffer layer and the first encapsulation film, wherein a WVTR of the first encapsulation film is about 0.1 g/m$^2$/day to about 100 g/m$^2$/day, and a WVTR of the second encapsulation film is about 1 g/m$^2$/day to about 50 g/m$^2$/day.

* * * * *